United States Patent [19]
Mori

[11] Patent Number: 5,281,872
[45] Date of Patent: Jan. 25, 1994

[54] CURRENT DETECTABLE TRANSISTOR HAVING SENSE RESISTOR WITH PARTICULAR TEMPERATURE COEFFICIENT

[75] Inventor: Shogo Mori, Kariya, Japan

[73] Assignee: Kabushiki Kaisha Toyoda Jidoshokki Seisakusho, Kariya, Japan

[21] Appl. No.: 47,822

[22] Filed: Apr. 15, 1993

[30] Foreign Application Priority Data

Apr. 16, 1992 [JP] Japan ................................. 4-096431

[51] Int. Cl.⁵ ..................... H03K 17/16; H03K 3/26
[52] U.S. Cl. .................................. 307/491; 307/310; 307/270; 307/299.2; 374/172; 374/183
[58] Field of Search ............... 374/183, 172; 307/310, 307/491, 270, 299.2

[56] References Cited

U.S. PATENT DOCUMENTS 5,061,863 10/1991 Mori et al. ...................... 307/310

Primary Examiner—Margaret R. Wambach
Attorney, Agent, or Firm—Brooks Haidt Haffner & Delahunty

[57] ABSTRACT

A current detectable transistor $T_r$ comprises a main transistor in which a main current flows and a sense transistor for detecting the current flowing in the main transistor. A sense resistance $R_S$ having a temperature coefficient $\alpha_S$ suitable for maintaining the constancy of a sense voltage $V_S$ regardless of a temperature change $\Delta T$ is provided at the emitter of the sense transistor. Because the sense voltage $V_S$ can be measured between the two ends of a sense resistor $R_S$ with little temperature drift, the sense voltage $V_S$ obtained as a detection result remains constant regardless of the temperature change $\Delta T$, thereby enabling a current to be detected with high precision.

12 Claims, 3 Drawing Sheets

CURRENT DETECTABLE TRANSISTOR HAVING SENSE RESISTOR WITH PARTICULAR TEMPERATURE COEFFICIENT

BACKGROUND OF THE INVENTION

1. Field of the Invention

This invention pertains to a current detectable transistor equipped with a main transistor in which a main current flows and a sense transistor for detecting a current flowing in the main transistor, and more particularly to a current detectable transistor having a stable sense voltage little affected by a temperature change by providing a resistor whose temperature coefficient is suitable for maintaining the constancy of the sense voltage regardless of temperature change.

2. Description of the Related Arts

A power transistor having a large current flow requires a swift detection of an overcurrent for its protection. For this purpose, a power transistor having an emitter terminal for detecting a current in addition to a sense transistor for detecting a current has been designed and put into a commercial use.

A current detectable transistor equipped with a main transistor in which a main current flows and a sense transistor for detecting the current flowing in the main transistor necessitates a resistance (hereafter referred to as a sense resistance) for obtaining the sense voltage as a voltage drop due to the current flowing in the sense transistor. Ordinarily, a sense resistance without a temperature dependency is used for accurately measuring the sense current value.

FIG. 1 shows an equivalent circuit when a current detectable transistor having a sense resistor is in saturation.

Generally in saturation, a main transistor and a sense transistor can be regarded as two resistances having a certain ratio. Assuming the main transistor and the sense transistor is formed by the plurality of cells, and the ratio of a member of cells of a main transistor to those of a sense transistor is n:1, and $R_{CE}$, is the on-resistance (the resistance to current flow in the normal direction between a collector and an emitter) of a main transistor, and the on-resistance of a sense transistor is expressed as $nR_{CE}$.

In the equivalent circuit shown in FIG. 1, the on-resistance $R_{CE}$ of the main transistor between its collector C and its emitter E is connected in parallel with the on-resistance $nR_{CE}$, of the sense transistor between the collector C and sense emitter $E_S$. Further, on-resistance $nR_{CE}$, of the sense transistor connects to the sense resistance $R_S$ in series.

Defining a collector current and a sense current respectively as $I_C$ and $I_S$, the sense voltage $V_S$ can be expressed as:

$$V_S = I_S R_S = \frac{R_{CE} R_S}{(n+1)R_{CE} + R_S} I_C \quad (1)$$

where $$I_S = \frac{R_{CE}}{(n+1)R_{CE} + R_S} I_C$$

Because the on-resistance $R_{CE}$, of a semiconductor element is temperature dependent, it can be expressed as $$R_{CE} = (1+\alpha_K \Delta T) R_{CEO} \quad (2)$$

where $\alpha_K$ is the temperature coefficient of a semiconductor element, $\Delta T$ is a temperature change, and $R_{CEO}$ is the initial value of on-resistance $R_{CE}$.

Because the sense resistance $R_S$ is not temperature dependent, sense voltage $V_S$ can be expressed as $$V_S = \frac{1}{\frac{(n+1)}{R_S} + \frac{1}{(1 + \alpha_K \Delta T) R_{CEO}}} I_C \quad (3)$$

As described above, even though the sense resistance $R_S$ is not temperature dependent, on-resistance $R_{CE}$ is temperature dependent. Therefore, as is evident from above expression (3), a temperature change causes the sense voltage $V_S$ to change. Consequently, the value of an overcurrent cannot be determined accurately, thereby preventing a current from being detected with high precision.

A solution to this problem has been considered, in which a separate resistance is provided for compensating for the change of the sense resistance $R_S$ due to temperature change, thereby making the sense voltage $V_S$ constant regardless of a temperature change. However, because this solution invites an increase in the number of parts, it is contrary to the need for miniaturizing the transistor.

SUMMARY OF THE INVENTION

This invention, conceived based on the above background, aims at detecting a current with high precision by making the sense voltage obtained as a detection result constant regardless of temperature change.

That is, this invention is such that a current detectable transistor equipped with a main transistor in which a main current flows and a sense transistor for detecting the main current flowing in the main transistor has at its sense transistor emitter a sense resistance whose temperature coefficient, set to an approximation of a value given by expression (A) suitable for maintaining the constancy of the sense voltage regardless of a temperature change.

$$\alpha_S = \frac{-R_{SO}}{(n+1)R_{CEO}} \alpha_K \quad (A)$$

where $\alpha_S$ is the temperature coefficient of the sense resistance $R_S$, $\alpha_K$ is the temperature coefficient of a semiconductor element, $R_{CEO}$ is the initial value of on-resistance $R_{CE}$, $R_{SO}$ is the initial value of sense resistance $R_S$, and n is the ratio of a number of cells of the main transistor as against that of the sense transistor and more specially n is the ratio of an emitter junction area of the main transistor to that of the sense transistor.

Optionally, the current detectable transistor may have the collector and base of the main transistor connected respectively to the collector and base of the sense transistor.

In addition, the current detectable transistor may have the emitter of the sense transistor connected to the emitter of the main transistor through the sense resistance having the above temperature coefficient.

Furthermore, the current detectable transistor may have its main transistor, sense transistor and sense resistor formed on a single semiconductor substrate.

The above structures eliminate the temperature drift of a sense voltage, thereby enabling a current to be detected with high precision.

BRIEF DESCRIPTION OF THE DRAWINGS

One of ordinary skill in the art can easily understand additional features and objects of this invention from the description of the preferred embodiments and attached drawings. In the drawings.

DESCRIPTION OF A PREFERRED EMBODIMENT

Figure 2:
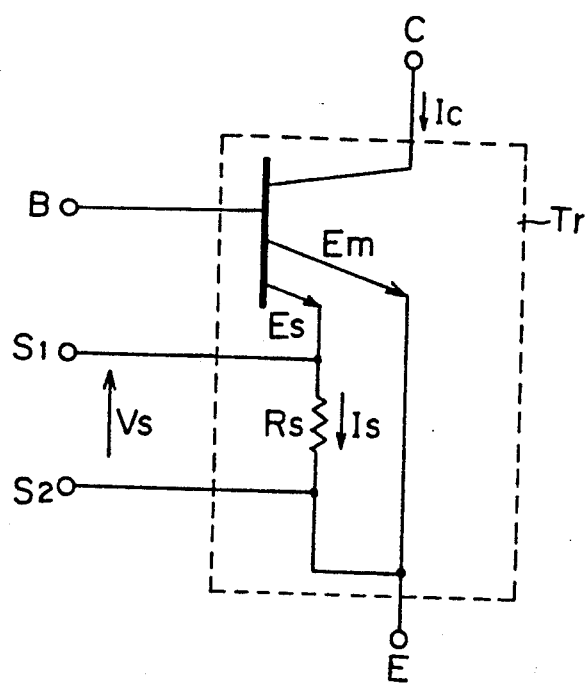
FIG. 2 schematically shows a configuration of a current detectable transistor of this invention.

FIG. 2 schematically shows a configuration of a current detectable transistor of this invention.

A current detectable transistor $T_r$ comprises a main transistor in which a main current flows and a sense transistor for detecting the current flowing in the main transistor. The main transistor and the sense transistor has its each collector and base, the collector C and base B of the main transistor are connected respectively to the collector and base of the sense transistor, which extrude out of the cell unit represented by the dashed lines. As with the collector C and the base B, the emitter E of the transistor, extends out of the cell unit body. And, the main emitter $E_m$, i.e. the emitter of the main transistor is connected to this emitter E.

The sense emitter $E_s$, i.e. the emitter of the sense transistor is connected to the emitter E through the sense resistance $R_S$ having a temperature coefficient, which will be described later. The connecting part between the sense emitter and the sense resistor sticks out of the cell unit as one sense voltage detection terminal $S_1$. Also, the connecting part between the sense resistor $R_S$ and the main emitter E sticks out of the cell unit as another sense voltage detection terminal $S_2$.

This embodiment assumes that the main transistor, the sense transistor and the sense resistor $R_S$ are formed on a single semiconductor substrate made, for example, of silicon.

Figure 3:
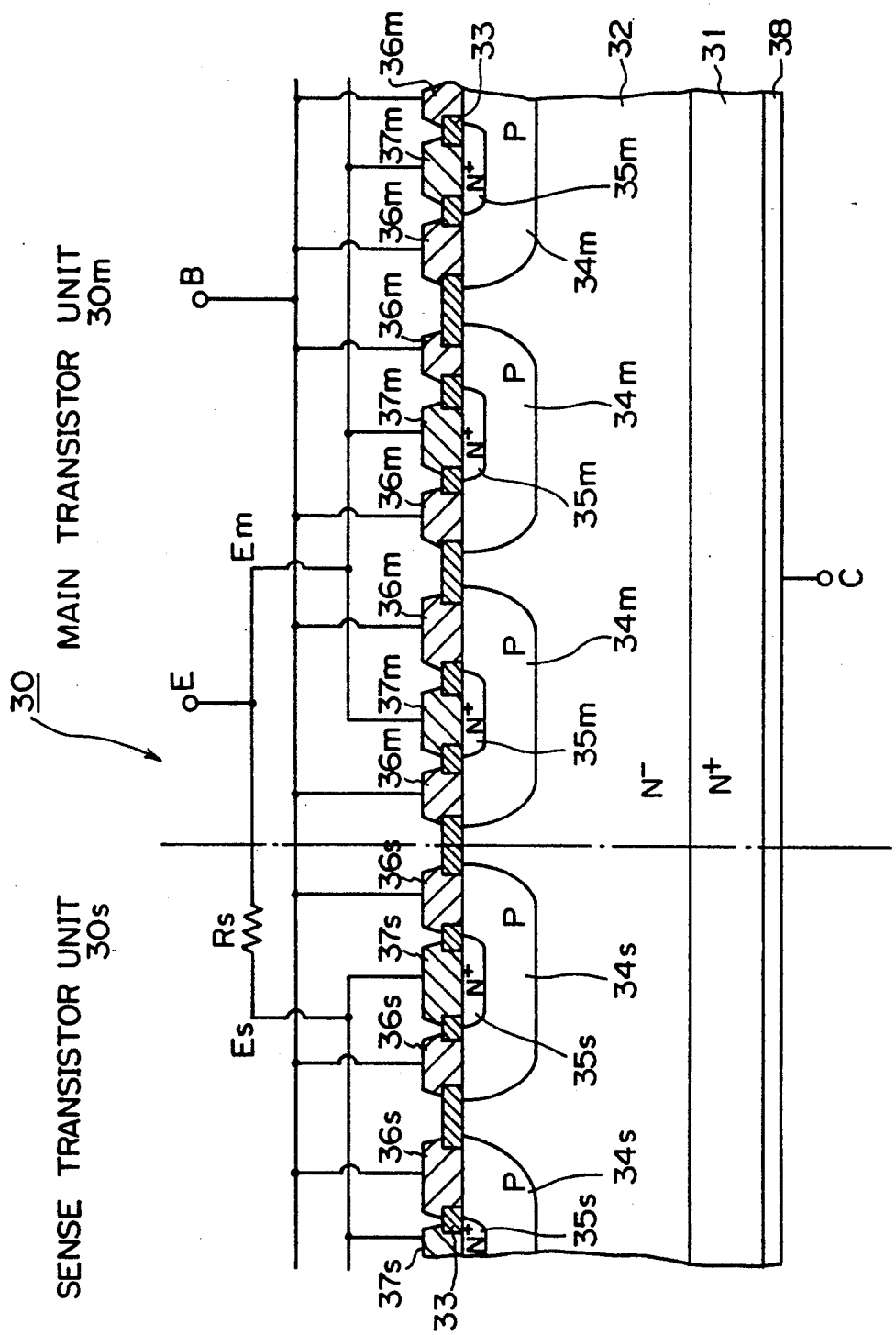
FIG. 3 is a sectional view showing the internal structure of the semiconductor device in which a bipolar transistor having the circuit shown in FIG. 2 is provided.

FIG. 3 is a sectional view showing the internal structure of the semiconductor device in which a bi-polar transistor having the circuit shown in FIG. 2 is provided.

In FIG. 3, $N^+$-type silicon substrate 31 is a collector area common to a main transistor unit 30m and a sense transistor unit 30s of the NPN bi-polar transistor 30. The $N^+$-type silicon substrate 31 is covered with epitaxial growth to form an N-type epitaxial layer 32. Then, silicon oxide film (SiO$_2$) 33 is formed over the layer. Alternately repeating the formation and the removal of the film forms a plurality of P-type base areas 34m and 34s at predetermined intervals by the effect of thermal diffusion. Thus, the P-type base area 34m is a base area of the main transistor unit 30m, and the P-type base area 35s is a base area of the sense transistor unit 30s.

An $N^+$type emitter area 35m of the main transistor unit 30m is formed over each of the P-type base areas 34m, and an $N^+$type emitter area 35s of the sense transistor unit 30s is formed over each of the P-type base areas 34s.

Through the holes made in the silicon oxide film 33, a base electrode 36m of the main transistor unit 30m is provided on each of the P-type base areas 34m, and an emitter electrode 37m of the main transistor unit 30m is provided on each of the $N^+$ type emitter area 35m. Likewise, through the holes made in the silicon oxide film 33, a base electrode 36s of the sense transistor unit 30s is provided on each of the P-type base areas 34s, and an emitter electrode 37s of the sense transistor unit 30s is provided on each of the $N^+$ type emitter area 35s.

Then, a collector electrode 38 is provided on the back of the $N^+$ type silicon substrate 31, that is, a common collector area. Thus, the main transistor unit 30m and the sense transistor unit 30s of the NPN bi-polar transistor 30 can be provided with a common collector terminal C.

Furthermore, a plurality of base electrodes 36m of the main transistor unit 30m and a plurality of base electrodes 36s of the sense transistor unit 30s are duly connected to a common base terminal B.

A plurality of emitter electrodes 37m of the main transistor unit 30m are duly connected to a main emitter terminal $E_m$, and led to an emitter terminal E of the NPN transistor 30 through the main emitter terminal $M_E$.

Then, a plurality of emitter electrodes 37s of the sense transistor unit 30s are duly connected to a sense emitter terminal $E_s$, and the sense emitter terminal $E_s$ is connected to an emitter terminal E of the NPN transistor 30 through a sense resistance $R_S$.

The above described example relates to an NPN transistor. However, the present invention can also apply to a PNP transistor.

The following is a description of the temperature coefficient of the sense resistor $R_S$ suitable for maintaining the constancy of the sense voltage regardless of temperature change.

FIG. 2 represents the equivalent circuit when the current detectable transistor $T_r$ of this embodiment is in saturation.

Parts used in the description of this embodiment which are the same as those used in the description of the related arts have the same codes. This embodiment assumes that sense resistor $R_S$ also is temperature dependent.

$$R_S = (1 + \alpha_S \Delta T) R_{SO} \quad (4)$$

where $\alpha_S$ is the temperature coefficient of a sense resistor $R_S$, $\Delta T$ is a temperature change, and $R_{SO}$ is the initial value of on-resistance $R_S$.

Consequently, expression (1) can be transformed as $$V_S = \frac{(1 + \alpha_K \Delta T) R_{CEO} (1 + \alpha_S \Delta T) R_{SO}}{(n + 1)(1 + \alpha_K \Delta T) R_{CEO} + (1 + \alpha_S \Delta T) R_{SO}} I_C \quad (5)$$

Described below is the determination of the necessary and sufficient condition for the sense voltage $V_S$ to be constant regardless of the temperature change $\Delta T$, which is obtained by using a linear approximation with respect to the temperature change $\Delta T$.

Figure 1:
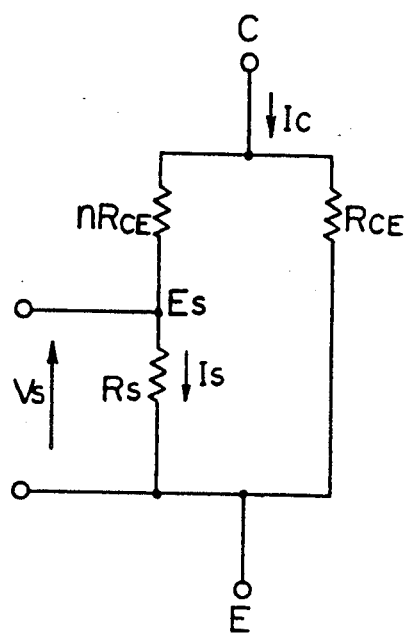
FIG. 1 shows an equivalent circuit when a current detectable transistor having a sense resistor is in saturation.

As set out earlier in the description of FIG. 1, because $$(nR_{CE} + R_S)I_S = R_{CE}(I_C - I_S)$$

$$V_S = I_S R_S = \frac{R_{CE} R_S}{(n+1)R_{CE} + R_S} I_C \quad (1)$$

Also, $$R_{CE} = (1 + \alpha_K \Delta T) R_{CEO} \quad (2)$$

$$R_S = (1 + \alpha_S \Delta T) R_{SO} \quad (4)$$

Hence, from expression (1), (2) and (4), $$V_S = \frac{(1 + \alpha_K \Delta T)(1 + \alpha_S \Delta T) R_{CEO} R_{SO} I_C}{(n+1)(1 + \alpha_K \Delta T) R_{CEO} + (1 + \alpha_S \Delta T) R_{SO}} \quad (5)$$

$$= M R_{CEO} R_{SO} I_C$$

According to expression (5), M can be linearly approximated as $$M = \frac{(1 + \alpha_K \Delta T)(1 + \alpha_S \Delta T)}{(n+1)(1 + \alpha_K \Delta T) R_{CEO} + (1 + \alpha_S \Delta T) R_{SO}}$$

$$= \frac{1 + (\alpha_K + \alpha_S) \Delta T}{(n+1) R_{CEO} + R_{SO} + \{(n+1)\alpha_K R_{CEO} + \alpha_S R_{SO}\} \Delta T}$$

The derivative of M with respect to $\Delta T$ is obtained by $$M' = \frac{(\alpha_K + \alpha_S)[(n+1)R_{CEO} + R_{SO} + \{(n+1)\alpha_K R_{CEO} + \alpha_S R_{SO}\} \Delta T]}{[(n+1)R_{CEO} + R_{SO} + \{(n+1)\alpha_K R_{CEO} + \alpha_S R_{SO}\} \Delta T]^2} -$$

$$\frac{[\{1 + (\alpha_K + \alpha_S)\Delta T\} \{(n+1)\alpha_K R_{CEO} + \alpha_S R_{SO}\}]}{[(n+1)R_{CEO} + R_{SO} + \{(n+1)\alpha_K R_{CEO} + \alpha_S R_{SO}\} \Delta T]^2}$$

When $M' = 0$, $(\alpha_K + \alpha_S)[(n+1)R_{CEO} +$ $$R_{SO} + \{(n+1)\alpha_K R_{CEO} + \alpha_S R_{SO}\} \Delta T] =$$

$$\{1 + (\alpha_K + \alpha_S)\Delta T\} \{(n+1)\alpha_K R_{CEO} + \alpha_S R_{SO}\} (\alpha_K +$$

$$\alpha_S) \{(n+1)R_{CEO} + R_{SO}\} = (n+1)\alpha_K R_{CEO} + \alpha_S R_{SO}$$

This is transformed into $$\alpha_S(n+1) R_{CEO} = -\alpha_K R_{SO}$$

Therefore, $$\alpha_S = -\frac{R_{SO}}{(n+1)R_{CEO}} \alpha_K \quad (6)$$

where $\alpha_S$ is the temperature coefficient of the sense resistance $R_S$, $\alpha_K$ is the temperature coefficient of the semiconductor element, $R_{CEO}$ is the initial value of the on-resistance $R_{CE}$, $R_{SO}$ is the initial value of the sense resistance $R_S$, and n is the ratio of a number of cells of the main transistor as against those of the sense transistor.

Expression (6) represents the necessary and sufficient condition for the sense voltage $V_S$ to be constant regardless of the temperature change $\Delta T$. The variation within 10% of the temperature coefficient $\alpha_S$ satisfying the expression (6) can be used as a scope of the present invention.

Accordingly, if the temperature coefficient $\alpha_S$ of the sense resistance $R_S$ is set to satisfy expression (6), the sense voltage $V_S$ can be held constant regardless of the temperature change $\Delta T$. That is, a provision of the sense resistance $R_S$ having the temperature coefficient $\alpha_S$ at the emitter of the sense transistor enables the sense voltage $V_S$ measured between the two ends of the sense resistor $R_S$ to be little affected by a temperature change. The value given by expression (6) is obtained by using a linear approximation. Then, a temperature coefficient of a sense resistor $R_S$ can be an approximation of the value given by expression (6) with the constancy of a sense voltage $V_S$ maintained regardless of a temperature change.

Polysilicon (having a negative temperature coefficient) forms the sense resistance $R_S$ on a silicon substrate together with the main and sense transistors, for example. The value of the temperature coefficient $\alpha_S$ of the sense resistance $R_S$ can be suitably set by changing various conditions, such as the concentration of an impurity and the formation process.

Although the above description relates to an embodiment in which this invention is applied to an ordinary transistor, it goes without saying that this invention can also be applied to an FET (field effect transistor) and an SIT (static induction transistor), in which case collector, emitter and base correspond respectively to drain, source and gate.

As described above, this invention enables a current detectable transistor to have a constant sense voltage $V_S$ measured between the two ends of the sense resistance $R_S$ regardless of the temperature change $\Delta T$.

What is claimed is:

1. A current detectable transistor comprising:
   a main transistor in which a main current flows
   a sense transistor for detecting the current flowing in said main transistor and a sense resistance provided at the emitter of said sense transistor,
   said sense resistance having a temperature coefficient set to an approximation of a value given by expression (A) suitable for maintaining the constancy of a sense voltage regardless of a temperature change, $$\alpha_S = -\frac{R_{SO}}{(n+1)R_{CEO}} \alpha_K \quad (A)$$

where $\alpha_S$ is the temperature coefficient of the sense resistance $R_S$, $\alpha_K$ is the temperature coefficient of a semiconductor element, $R_{CEO}$ is the initial value of on-resistance $R_{CE}$, $R_{SO}$ is the initial value of said sense resistance $R_S$, and n is the ratio of the number of cells of the main transistor to those of the sense transistor.

2. The current detectable transistor according to claim 1, wherein:
   the main transistor and the sense transistor has its each collector and base, the collector and base of said main transistor are connected respectively to the collector and base of said sense transistor.

3. The current detectable transistor according to claim 2, wherein:
   the emitter of said main transistor is connected to the emitter of said sense transistor through said sense resistance $R_S$ having said temperature coefficient $\alpha_S$.

4. The current detectable transistor according to claim 3, wherein:

the emitter of said main transistor is connected to the emitter of said sense transistor through said sense resistance $R_S$ having said temperature coefficient $\alpha_S$.

5. The current detectable transistor according to claim 2, wherein:

the emitter of said main transistor is connected to the emitter of said sense transistor through said sense resistance $R_S$ having said temperature coefficient $\alpha_S$.

6. The current detectable transistor according to claim 1, wherein:

the emitter of said main transistor is connected to the emitter of said sense transistor through said sense resistance $R_S$ having said temperature coefficient $\alpha_S$.

7. The current detectable transistor according to claim 1, wherein:

the emitter of said main transistor is connected to the emitter of said sense transistor through said sense resistance $R_S$ having said temperature coefficient $\alpha_S$.

8. A current detectable transistor comprising:

a main transistor in which a main current flows a sense transistor for detecting the current flowing in said main transistor and a sense resistance provided at the emitter of said sense transistor, said sense resistance having a temperature coefficient set to a value given by expression (A) suitable for maintaining the constancy of a sense voltage regardless of a temperature change, $$\alpha_S = -\frac{R_{SO}}{(n+1)R_{CEO}} \alpha_K \quad (A)$$

where $\alpha_S$ is the temperature coefficient of the sense resistance $R_S$, $\alpha_K$ is the temperature coefficient of a semiconductor element, $R_{CEO}$ is the initial value of on-resistance $R_{CE}$, $R_{SO}$ is the initial value of said sense resistance $R_S$, and n is the ratio of the number of cells of the main transistor to those of the sense transistor and wherein $R_S$ is a linear approximation of a temperature coefficient with regard to a temperature variation, said temperature coefficient satisfying an expression $V_S = I_S R_S$ so that a sense voltage $V_S$ is kept constant regardless of temperature variation, where $V_S$ is a sense voltage, $I_S$ is a sense current and $R_S$ is a sense register with regard to the sense transistor.

9. The current detectable transistor according to claim 8, wherein:

the main transistor and the sense transistor has its each collector and base the collector and base of said main transistor are connected in common to the collector and base of said sense transistor.

10. The current detectable transistor according to claim 8, wherein:

the emitter of said main transistor is connected to the emitter of said sense transistor through said sense resistance $R_S$ having said temperature coefficient $\alpha_S$.

11. The current detectable transistor according to claim 8, wherein:

said main transistor, said sense transistor and said sense resistance $R_S$ are formed on a single semiconductor substrate.

12. A current detectable transistor comprising:

a main transistor in which a main current flows a sense transistor for detecting the current flowing in said main transistor and a sense resistance provided at the emitter of said sense transistor, said sense resistance having a temperature coefficient set to a value given by expression (A) suitable for maintaining the constancy of a sense voltage regardless of a temperature change, $$\alpha_S = -\frac{R_{SO}}{(n+1)R_{CEO}} \alpha_K \quad (A)$$

where $\alpha_S$ is the temperature coefficient of the sense resistance $R_S$, $\alpha_K$ is the temperature coefficient of a semiconductor element, $R_{CEO}$ is the initial value of on-resistance $R_{CE}$, $R_{SO}$ is the initial value of said sense resistance $R_S$, and n is the ratio of the number of cells of the main transistor to those of the sense transistor.

* * * * *